United States Patent
Cho et al.

(10) Patent No.: US 10,991,813 B1
(45) Date of Patent: Apr. 27, 2021

(54) FABRICATION METHOD OF SEMICONDUCTOR DEVICE HAVING SIGE SHELL CHANNEL AND SEMICONDUCTOR DEVICE FABRICATED BY THE SAME

(71) Applicant: Gachon University of Industry-Academic cooperation Foundation, Seongnam-si (KR)

(72) Inventors: Seongjae Cho, Seoul (KR); EunSeon Yu, Seoul (KR)

(73) Assignee: GACHON UNIVERSITY OF INDUSTRY-ACADEMIC COOPERATION FOUNDATION

(*) Notice: Subject to any disclaimer, the term of this patent is extended or adjusted under 35 U.S.C. 154(b) by 0 days.

(21) Appl. No.: 16/698,927

(22) Filed: Nov. 27, 2019

(30) Foreign Application Priority Data

Oct. 24, 2019 (KR) .................. 10-2019-0133195

(51) Int. Cl.
| | | |
|---|---|---|
| H01L 29/66 | (2006.01) | |
| H01L 29/161 | (2006.01) | |
| H01L 29/775 | (2006.01) | |
| H01L 29/78 | (2006.01) | |

(52) U.S. Cl.
CPC ...... *H01L 29/66795* (2013.01); *H01L 29/161* (2013.01); *H01L 29/66439* (2013.01); *H01L 29/775* (2013.01); *H01L 29/785* (2013.01)

(58) Field of Classification Search
CPC ............. H01L 29/66795; H01L 29/161; H01L 29/66439; H01L 29/775; H01L 29/785
See application file for complete search history.

(56) References Cited

U.S. PATENT DOCUMENTS

2008/0135949 A1* 6/2008 Lo .................. B82Y 10/00
257/401

FOREIGN PATENT DOCUMENTS

KR          10-0585111          6/2006

OTHER PUBLICATIONS

Nature, vol. 420—Nov. 2002, pp. 57-61.

* cited by examiner

*Primary Examiner* — Herve-Louis Y Assouman
(74) *Attorney, Agent, or Firm* — Gerald E. Hespos; Michael J. Porco; Matthew T. Hespos

(57) ABSTRACT

A method for fabricating a semiconductor device is carried out so that silicon nanowires may be made of vertically stacked one or more floating silicon layers, and a silicon buffer layer may be surrounded on each surface of the silicon nanowires with a sufficient thickness, e.g., close to the diameter of the nanowire, and then a silicon germanium shell may be formed on it. Thus, a semiconductor device having a silicon germanium shell channel structure can be fabricated with a uniform thickness even on a bulk silicon substrate using a conventional silicon CMOS process.

19 Claims, 11 Drawing Sheets

FABRICATION METHOD OF SEMICONDUCTOR DEVICE HAVING SIGE SHELL CHANNEL AND SEMICONDUCTOR DEVICE FABRICATED BY THE SAME

CROSS-REFERENCE TO RELATED APPLICATION

This application claims priority to Korean Patent Application No. 10-2019-0133195, filed on Oct. 24, 2019, under 35 U.S.C. 119, the entire contents of which are hereby incorporated by reference.

BACKGROUND

Field of the Invention

The present invention relates to a method for fabricating a semiconductor device, and more particularly, to a method for fabricating a semiconductor device capable of vertically stacking semiconductor devices having a horizontally arranged silicon germanium shell channel, and a semiconductor device fabricated thereby.

Related Art

The semiconductor devices may be largely divided into a transistor used as a switching device and a memory device further having a storage node in the transistor structure. Among transistors, metal-oxide-semiconductor field effect transistors (MOSFETs) are classified into n-channel MOSFETs having an electron channel and p-channel MOSFETs having a hole channel. Recently, in the implementation of p-channel MOSFET, many researches based on silicon germanium or germanium, which are known as materials having high hole mobility, have been conducted.

However, most of the technologies developed up to now have a complicated process, and thus, it is difficult to apply a commercially available silicon CMOS process as it is, and there is a problem in that a thin and uniform channel layer of silicon germanium cannot be formed on a silicon wire.

For example, Korean Patent No. 10-0585111 discloses a technique for forming a channel region of germanium or silicon germanium on three sides of a silicon body obtained by patterning a silicon layer of a silicon-on-insulator (SOI) substrate. However, since the silicon body is formed by patterning the SOI substrate, it is difficult to minimize the silicon body, and the gate is formed on the gate insulating film that is separately interposed between the channel region and itself surrounding the patterned SOI substrate. There is a problem that the gate controllability to the channel region is reduced and the process cost increases.

In addition, a technique has been developed in which a single-dimensional nanowire is vertically grown using gold as a seed and a germanium shell is formed using the nanowire as a core (Lincoln. J. Lauhon, et al., Epitaxial core-shell and core-multishell nanowire heterostructures, Nature, vol. 420, Nov. 2002, pp. 57-61). However, Au acts as a mobility killer in the silicon process, which negatively affects device performance, making difficulty in using the silicon process. It is also difficult to use for nano devices due to the difficulty in controlling a thickness of the germanium shell.

SUMMARY

The present invention is to provide a method of fabricating a semiconductor device capable of vertically stacking a semiconductor device having a silicon germanium shell channel on a bulk silicon substrate using a conventional silicon CMOS process, and a semiconductor device fabricated thereby.

To achieve the objectives, a method for fabricating a semiconductor device having a silicon germanium shell channel according to an embodiment of the present invention comprises a first step of forming an active layer by alternately stacking a silicon germanium layer and a silicon layer on a semiconductor substrate one or more times; a second step of sequentially forming a first insulating layer, a second insulating/layer, a third insulating layer, a silicon layer for etching the lower insulating layers, and a fourth insulating layer for dummy patterns on the active layer; a third step of forming one or more dummy patterns by etching the fourth insulating layer; a fourth step of forming a sidewall insulating layer on each sidewall of the dummy patterns; a fifth of forming a plurality of channel fine patterns by removing both ends of the sidewall insulating layer exposed by removing the dummy patterns; a sixth of forming a source and drain patterns at both ends of the plurality of channel fine patterns, at least one of the channel fine patterns connecting the source and drain patterns; a seventh step of etching the lower insulating layer etching silicon layer using the source and drain patterns and the channel fine patterns as an etching hard mask; an eighth step of forming a first insulating layer pattern, a second insulating layer pattern, and a third insulating layer pattern by etching the third insulating layer, the second insulating layer, and the first insulating layer sequentially to expose the active layer using a silicon mask pattern of the lower insulating layer etching silicon layer exposed after removing the source and drain patterns and the channel fine patterns; a ninth step of forming an active layer pattern by etching the active layer and a part of the semiconductor substrate sequentially using an insulating mask pattern of the third insulating layer exposed after removing the silicon mask pattern; a tenth step of covering the etched semiconductor substrate, the active layer pattern, the first insulating layer pattern, the second insulating layer pattern, and the third insulating layer pattern with a fifth insulating layer and exposing the second insulating layer pattern through a planarization process; an eleventh step of forming a separation insulating layer on the etched semiconductor substrate by etching the fifth insulating layer using the second insulating pattern and the first insulating pattern as a mask; a twelfth step of forming a dummy gate on the separation insulating layer to surround the first insulating layer pattern and the active layer pattern; a thirteenth step of covering a channel fin including the dummy gate, the first insulating layer pattern, and the active layer pattern with the sixth insulating layer on the separation insulating layer, and exposing the dummy gate through a planarization process; a fourteenth step of exposing the channel fin to a space in which the dummy gate is removed; a fifteenth step of selectively etching silicon germanium layers in the exposed channel fin to float silicon layers; a sixteenth step of forming a silicon buffer layer around each of the floating silicon layers; a seventeenth step of forming a silicon germanium shell on the silicon buffer layer; and an eighteenth step of sequentially forming a gate insulating film and a gate surrounding the silicon germanium shell.

The active layer of the first step may be formed by alternately stacking a silicon germanium layer and a silicon layer three or more times, and the source and drain patterns of the sixth step may be formed at both ends of two or more of the channel fine patterns.

The first insulating layer, the third insulating layer and the fourth insulating layer may be silicon oxide films, and the second insulating layer may be a silicon nitride film.

A surface treatment process may be further advanced between the fifteenth and sixteenth steps by flowing a predetermined gas around the floating silicon layers.

The gas may be a mixture of $NF_3$ and $NH_3$ or $H_2$, process conditions for forming the silicon buffer layer may be 670° C., 30 Torr, $H_2$ 40 SLM, DCS 300 sccm, and 300 sec, and process conditions for forming the silicon germanium shell may be 670° C., 30 Torr, $H_2$ 40 SLM, DCS 750 sccm, $GeH_4$ 50 sccm, HCl 250 sccm, and 48 sec.

The gate insulating film surrounds the silicon germanium shell, and an aluminum oxide layer $Al_2O_3$ and a hafnium oxide layer $HfO_2$ may be sequentially stacked.

A method for fabricating a semiconductor device having a silicon germanium shell channel according to another embodiment of the present invention comprises forming an active layer pattern by alternately stacking a silicon germanium layer and a silicon layer on a semiconductor substrate one or more times, and forming a dummy gate by wrapping the active layer pattern on a predetermined separation insulating layer, and further comprises a first step of covering the dummy gate and the active layer pattern, which is a channel fin, on the separation insulating layer with an insulating layer, and exposing the dummy gate by a planarization process; a second step of exposing the channel fin to a space in which the dummy gate is removed; a third step of selectively etching silicon germanium layers in the exposed channel fin to float silicon layers; a fourth step of forming a silicon buffer layer around each of the floating silicon layers; a fifth step of forming a silicon germanium shell on the silicon buffer layer; and a sixth step of sequentially forming a gate insulating film and a gate surrounding the silicon germanium shell.

In addition, the semiconductor device according to the present invention may have an ultra-thin channel of a silicon germanium shell surrounding the nanowire structure with a uniform thickness, which is fabricated by the above method.

In the method of fabricating a semiconductor device according to the present invention, silicon nanowires may be made of vertically stacked one or more floating silicon layers, and a silicon buffer layer may be surrounded on each surface of the silicon nanowires with a sufficient thickness, e.g., close to the diameter of the nanowire, and then a silicon germanium shell may be formed on it. By the present invention, there is an advantage that a semiconductor device having a silicon germanium shell channel structure can be fabricated with a uniform thickness even on a bulk silicon substrate using a conventional silicon CMOS process. system.

In these drawings, the following reference numbers are used throughout: reference number 10 indicates a semiconductor substrate, 20 an active layer, 22 a silicon germanium layer, 24 a silicon layer, 30 a first insulating layer, 40 a second insulating layer, 42a and 42b a channel fine pattern, 50 third insulating layer, 60 a lower insulating layer etching silicon layer, 70 a fourth insulating layer, 82 and 84 a source and drain patterns, 100 a channel fin, 110 and 120 a dummy gate, and 111 a space part.

DETAILED DESCRIPTION

Detailed descriptions of preferred embodiments of the present invention are provided below with accompanying drawings.

First Embodiment

The method of fabricating a semiconductor device according to a first embodiment of the present invention may proceed sequentially as shown in FIGS. 1 to 15.

Figure 1:
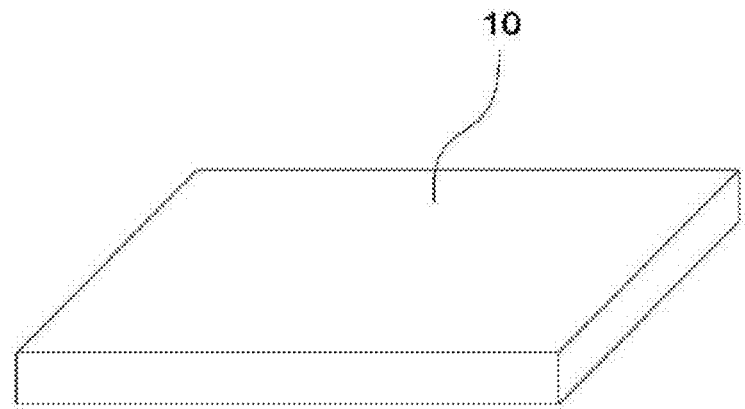
FIGS. 1 to 15 are the aerial and cross-sectional views illustrating a method of fabricating a semiconductor device according to an embodiment of the present invention.
Figure 2:
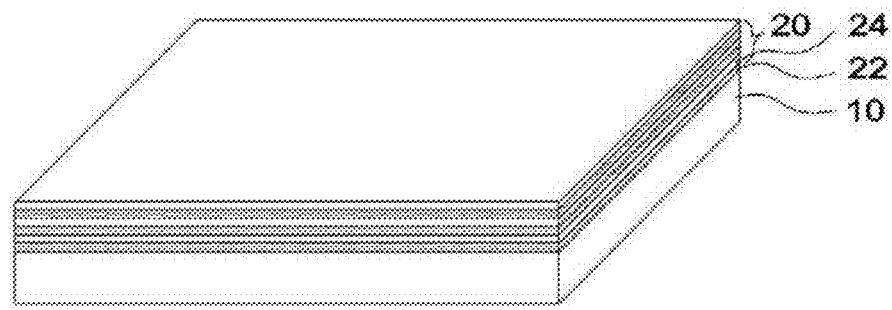

First, as shown in FIGS. 1 and 2, a silicon germanium layer 22 and a silicon layer 24 are alternately stacked one or more times on a semiconductor substrate 10 to form an active layer 20 (step 1).

Here, the semiconductor substrate 10 may be in any form as long as it is a material capable of forming the silicon germanium layer 22 by epitaxy. It may preferably be a bulk silicon substrate. In FIG. 2, although the silicon germanium layer 22 and the silicon layer 24 are alternately stacked three times, they may be stacked vertically as many as four or more times as well as one or two times to form the active layer 20. Before forming the active layer 20, it is preferable to perform a pre-cleaning process by a D. I. water:HF mixed at 200:1 for 200 seconds or a mixed gas of $NF_3$ and $NH_3$ and then to form the silicon germanium layer 22 or the silicon layer 24. In addition, it is preferable to thinly deposit a silicon layer as a buffer layer before stacking the active layer 20, since it is possible to expect dislocations and defect improvement and uniform thin film layers when depositing the active layer 20. When the silicon germanium layer 22 and the silicon layer 24 are alternately stacked, it is preferable to grow the germanium layer 22 after the silicon layer 24 is grown and etched by 1 to 2 nm using HCl and $H_2$ gas, and then, it is preferable to grow the germanium layer 22.

Figure 3:
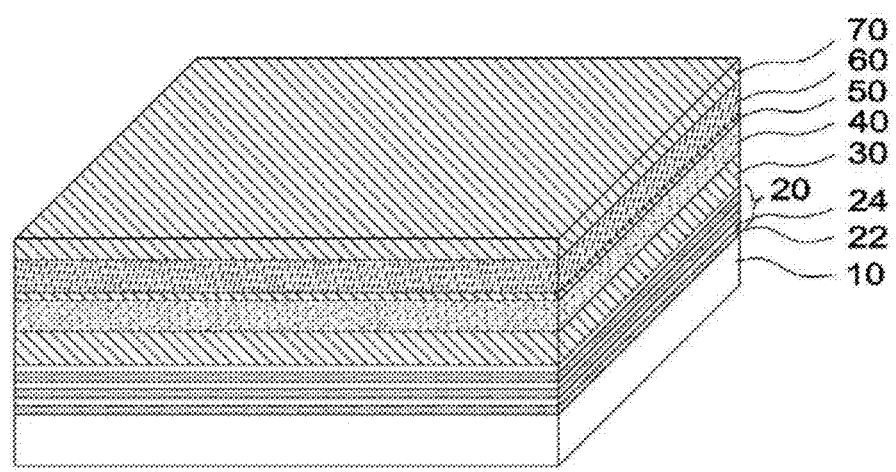

Next, as shown in FIG. 3, a first insulating layer 30, a second insulating layer 40, a third insulating layer 50, a lower insulating layer etching silicon layer 60, and a fourth insulating layer 70 for dummy patterns are sequentially formed on the active layer 20 (step 2).

Here, the first insulating layer 30, the third insulating layer 50, and the fourth insulating layer 70 may be silicon oxide layers, and the second insulating layer 40 may be a silicon nitride layer. The lower insulating layer etching silicon layer 60 may be formed of polysilicon (poly-Si) or amorphous silicon (α-Si) as a silicon based material layer for etching the lower insulating layers, e.g., the first to third insulating layers 30, 40 and 50. The third insulating layer 50 serves as an etching mask when the active layer 20 is etched, and may be thinner than the first insulating layer 30 depending on a selection ratio. The first insulating layer 30 is formed for a separation insulating layer, which will be described later, and the second insulating layer 40 is formed to function as an etching stopper during the planarization process. And the first and second insulating layers 30 and 40 are not limited to the material described above.

Figure 4:
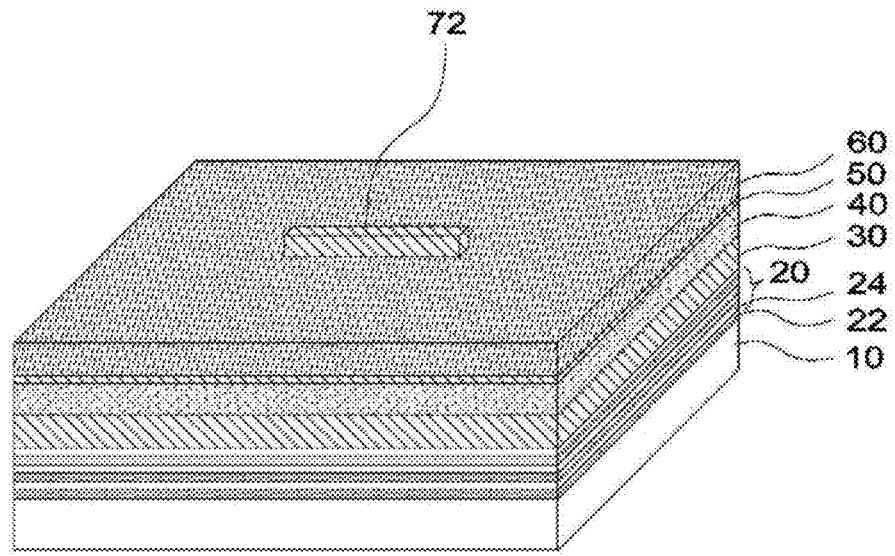
Figure 5:
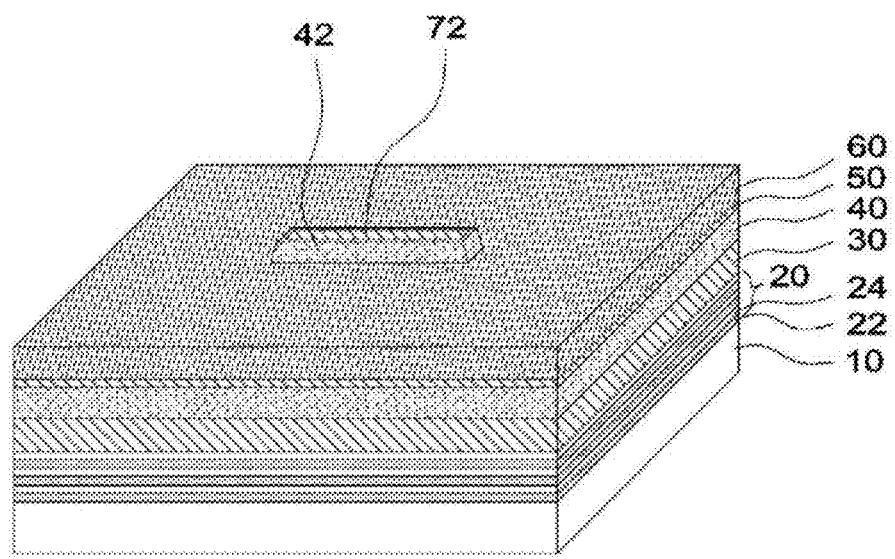
Figure 16:
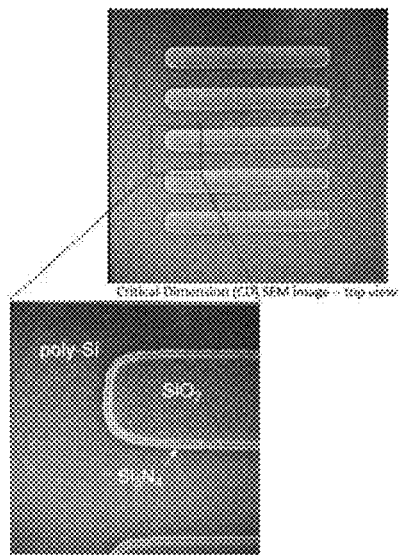
FIGS. 16 to 18 are top views of SEM images illustrating an embodiment of the present invention for forming ten channel fine patterns by sidewall patterning.

Next, as shown in FIGS. 4 and 5, the fourth insulating layer 70 is patterned to form one or more dummy patterns 72 (step 3), and a sidewall insulating layer having a thin width on the side of the dummy pattern 72 is formed (step 4). FIG. 16 shows five dummy patterns formed of silicon oxide $SiO_2$, which is the fourth insulating layer 70, on poly-Si which is the lower insulating layer etching silicon layer 60, and it shows the sidewall insulating layer 42 is formed of silicon nitride $Si_3N_4$ on the sidewall of each dummy pattern.

Figure 6:
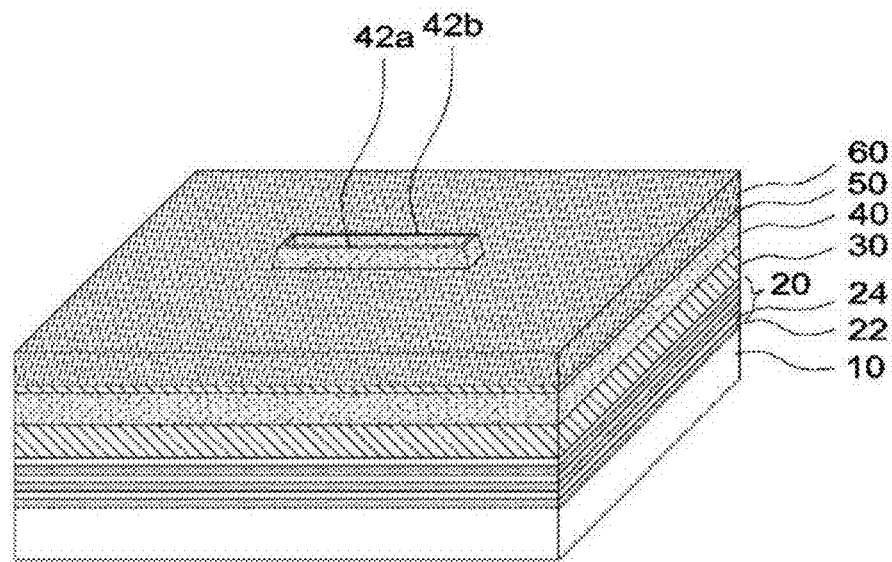
Figure 17:
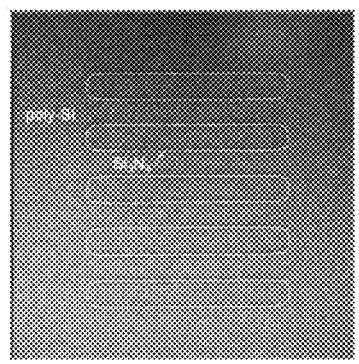
Figure 18:
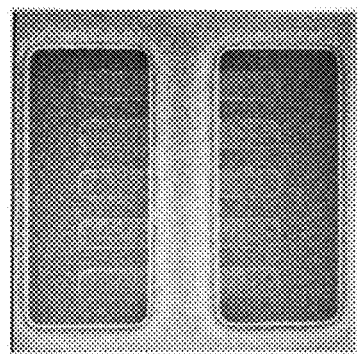

Next, as shown in FIG. 6, the dummy pattern 72 is removed, and both ends of the exposed sidewall insulating layer are removed to form a plurality of channel fine patterns 42a and 42b (step 5). FIG. 17 illustrates that the underlying silicon oxide layer $SiO_2$ is exposed by removing the dummy pattern of silicon oxide layer $SiO_2$ from FIG. 16, and that only the sidewalls of the silicon nitride layer $Si_3N_4$ remain. FIG. 18 shows that a plurality of channel fine patterns may be formed at one time by covering the sidewalls of the silicon nitride layer. $Si_3N_4$ with a photoresist film PR and developing PR after exposure so that only the both ends of the silicon nitride sidewalls are visible. As such, when the channel fine patterns are formed by a sidewall patterning, it is possible to form nanowire channels having a width (diameter) of 10 nm or less as described below by forming a fine line width as small as possible.

Figure 7:
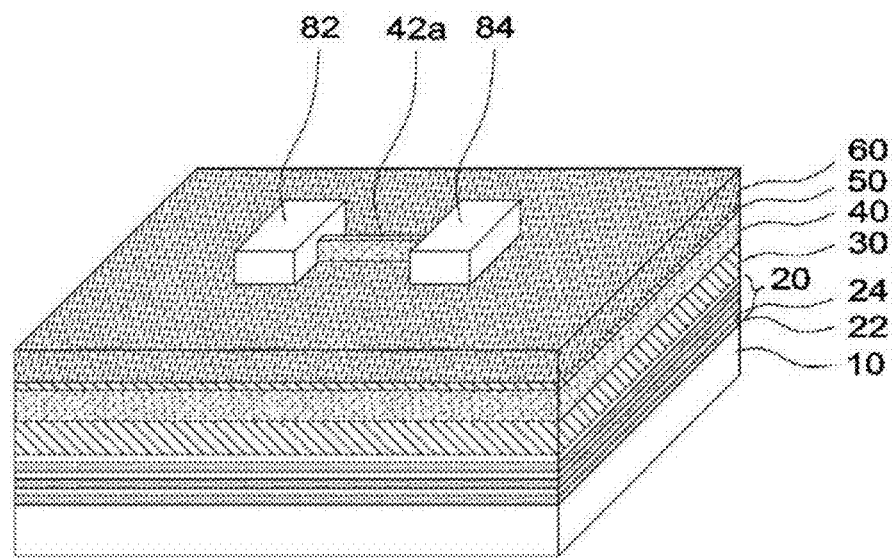

Next, as shown in FIG. 7, source and drain patterns 82 and 84 are formed at both ends of one or more 42a of the plurality of channel fine patterns 42a and 42b interposed therebetween (step 6). The source and drain patterns 82 and 84 may be formed of a photoresist film PR and may use a mix-and-match technique.

Figure 8:
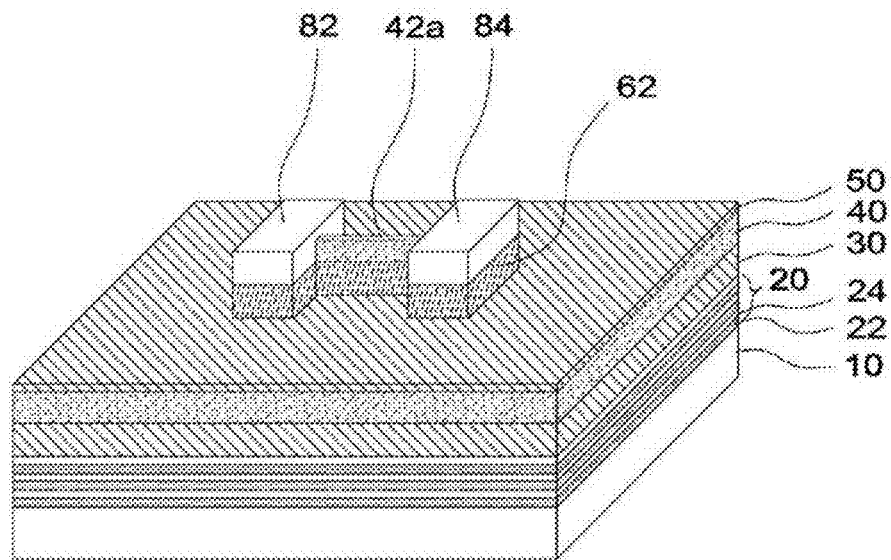

Next, as shown in FIG. 8, the lower insulating layer etching silicon layer 60 is etched by using the source and drain patterns 82 and 84 and the channel fine pattern 42a as an etch hard mask to form a silicon layer pattern 62. (step 7).

Figure 9:
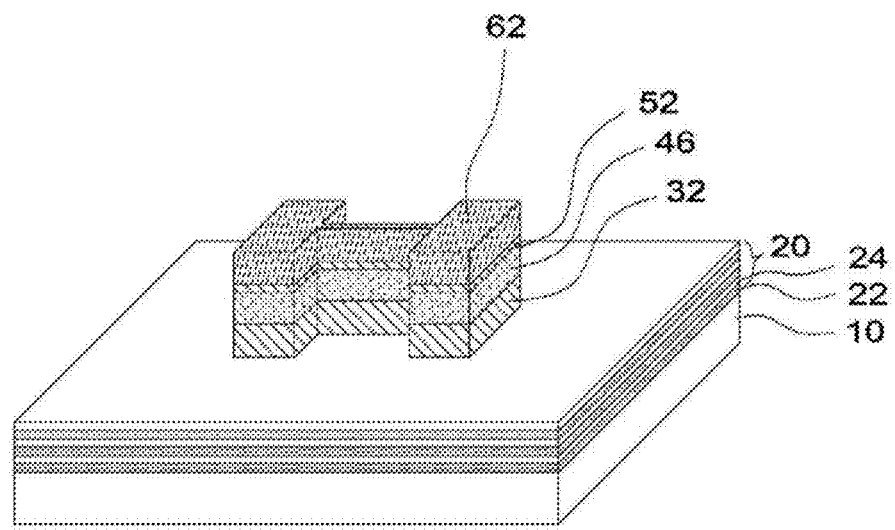

Next, as shown in FIG. 9, the second insulating layer 40 and the first insulating layer 30 are sequentially etched to expose the active layer 20 by using the silicon layer pattern 62 exposed after removing the source and drain patterns 82 and 84 and the channel micropattern 42a as a mask (step 8).

Figure 10:
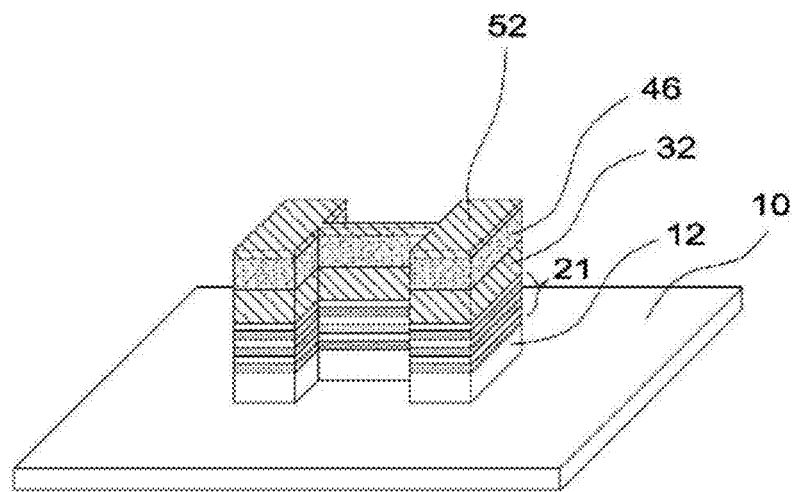

Next, as shown in FIG. 10, the active layer 20 and a part of the semiconductor substrate 10 are sequentially etched to form an active layer pattern 21 by using the silicon layer pattern 62 and the third insulating layer pattern 52 as etch hard masks (step 9). Here, when the silicon layer pattern 62, which is one of the hard masks, is made of the same material as the active layer, it is etched as the active layer is etched, and then the third insulating layer pattern 52 functions as a hard mask.

Figure 11:
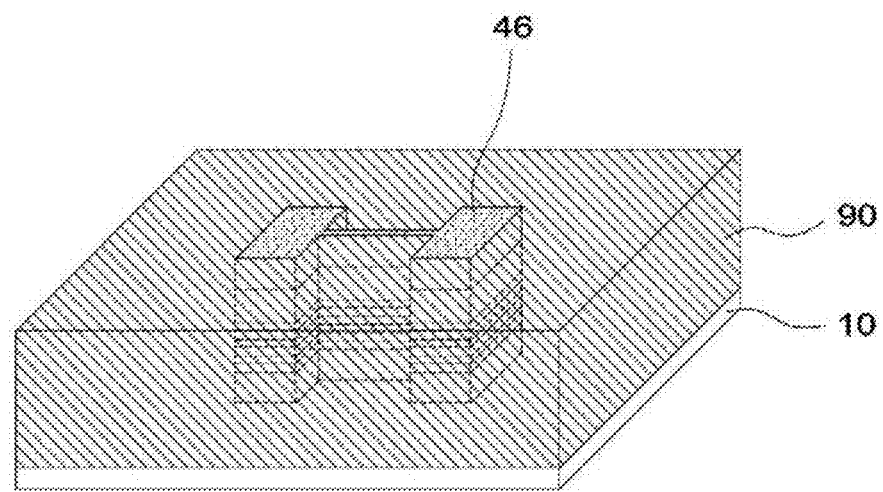

Subsequently, as shown in FIG. 11, a fifth insulating layer 90 is deposited on the etched semiconductor substrates 10 and 12, the active layer pattern 21, the first insulating layer pattern 32, the second insulating layer pattern 46, and the third insulating layer pattern 52. And the second insulating layer pattern 46 is exposed through a planarization process (step 10). Here, when the fifth insulating film 90 is a silicon oxide film, the second insulating film pattern 46 formed of the silicon nitride layer $Si_3N_4$ functions as an etch stopper of the planarization process, e.g., CMP process.

Figure 12:
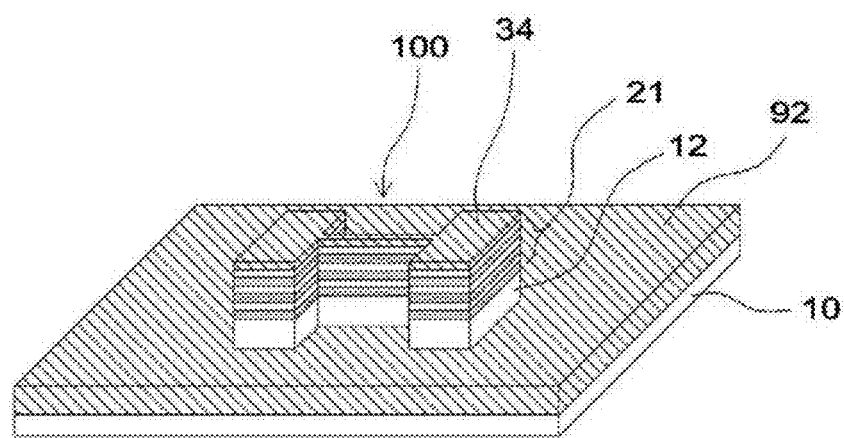

Next, as shown in FIG. 12, the fifth insulating layer 90 is etched using the second insulating layer pattern 46 and the first insulating layer pattern 32 as a mask to form a separation insulating layer 92 (e.g., an isolation oxide) on the etched semiconductor substrate 10 (step 11). In this case, the first insulating layer pattern 32 is partially etched according to the etching degree of the fifth insulating layer 90 so that it remains as a thin first insulating layer pattern 34 on the active layer pattern 21. By doing so, as shown in FIG. 12, a channel pin 100 is exposed.

Figure 13:
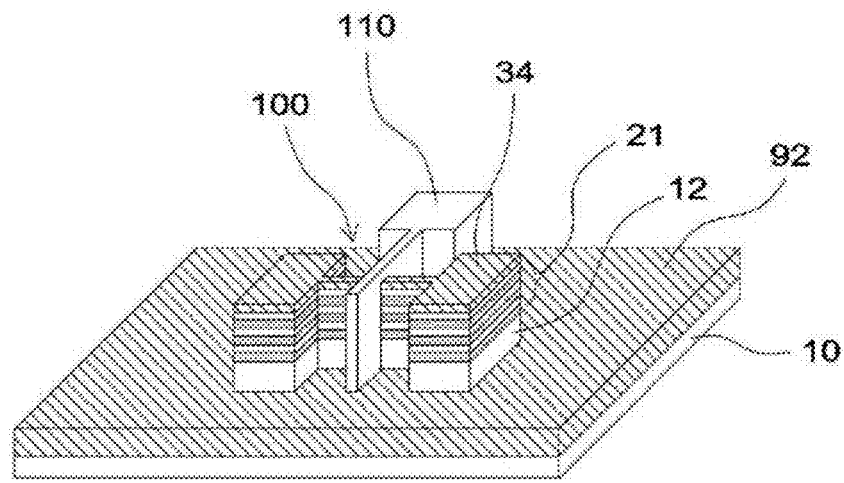

Subsequently, as shown in FIG. 13, a dummy gate 110 is formed on the isolation insulating layer 92 to surround the channel fin 100 formed of the first insulating layer pattern 34 and the active layer pattern 21 (step 12). Here, the dummy gate 110 may be formed of polysilicon, and a thin silicon oxide film may be first formed on the channel fin 100 before the dummy gate 110 is formed to protect the active region during the subsequent dummy gate etching. Thereafter, an impurity doping is performed on the channel region and the source and drain regions not covered by the dummy gate 110. Of course, instead of the impurity doping, an in-situ doping may be performed whenever the active layer 20 is formed in the first step, that is, whenever the silicon layer 24 is formed.

Figure 14:
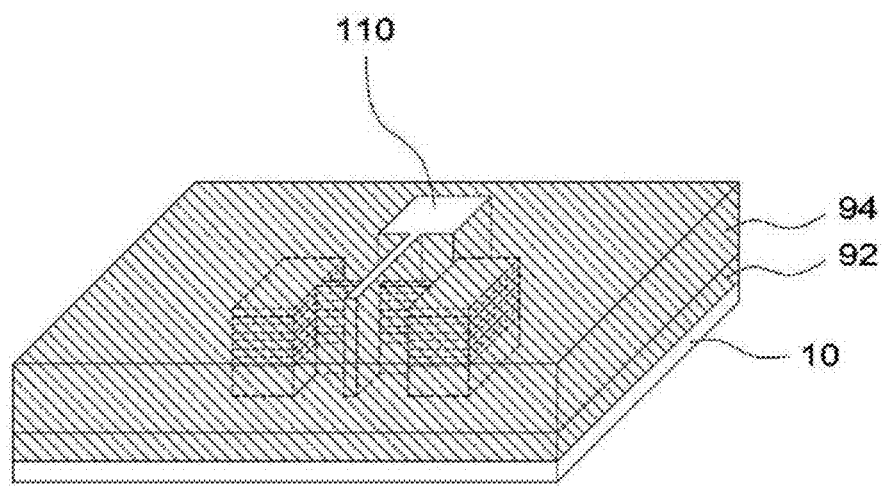

Next, as shown in FIG. 14, the dummy gate 110, the first insulating layer pattern 34, and the active layer pattern 21 are covered with a sixth insulating layer 94 on the separation insulating layer 92 and planarized to expose the dummy gate 110 (step 13). When the sixth insulating layer 94 is a silicon oxide layer, the dummy gate 110 formed of polysilicon functions as an etch stopper during the planarization process (e.g., CMP process).

Figure 19:
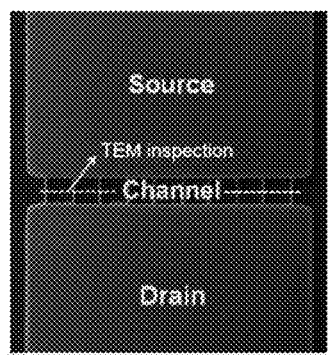
FIG. 19 is a plane view of an SEM image illustrating a semiconductor device connected horizontally by ten channel fins (active layer patterns) according to an embodiment of the present invention.
Figure 20:
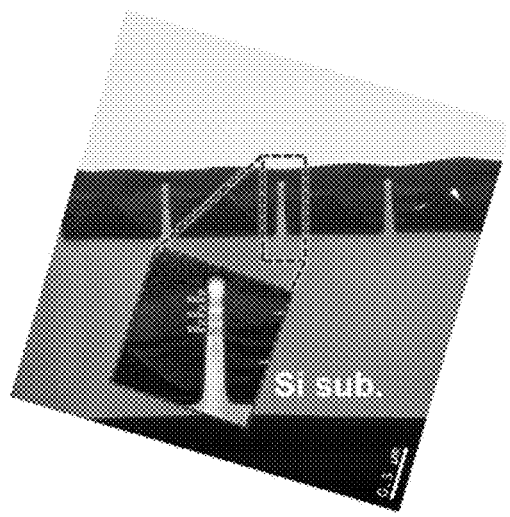
FIG. 20 is an enlarged view illustrating main parts of a TEM image and a stacked structure of channel fins (active layer patterns) showing a part of vertical cutting of 10 channels along the dotted line of FIG. 19.
Figure 21:
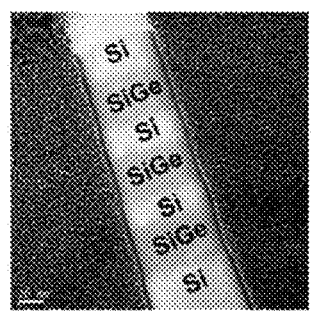
FIG. 21 is an enlarged TEM image of the stacked structure of the channel fins (active layer patterns) of FIG. 20, showing that the fins have a width of several tens of nm (30-40 nm).

FIG. 19 is a plan view of an SEM image showing a semiconductor device connected with 10 channel fins (i.e., 10 active layer patterns) horizontally in an embodiment in which a sidewall patterning is performed with an I-line stepper subsequent to FIG. 18. FIG. 20 is an enlarged view illustrating main parts of a TEM image and a stacked structure of channel fins (active layer patterns) showing a part of vertical cutting of 10 channels according to a dotted line of FIG. 19. FIG. 21 is an enlarged TEM image of the stacked structure of the channel fins (active layer patterns) of FIG. 20, showing that the fins have a width of several tens of nm (30-40 nm). Referring to FIGS. 19 to 21, it has ten channel fins (active layer patterns) horizontally, each of the channel fins (active layer patterns) may have a structure in which the silicon germanium layer 22 and the silicon layer 24 are alternately stacked three times. Accordingly, it is possible to fabricate a semiconductor device having a structure of a plurality of silicon nanowire channels stacked horizontally and vertically. Here, the film quality of the silicon layer and the silicon germanium shell may be improved by improving the surface of the nanowires with hydrogen gas before depositing the silicon layer (i.e., silicon buffer layer). In addition, the silicon nanowires may have a diameter of 10 nm or less, and according to the process described later, by forming a silicon germanium shell on the surface of each silicon nanowire to a thickness close to the nanowire diameter, a semiconductor device having a silicon germanium shell channel of uniform thickness can be fabricated.

Figure 15:
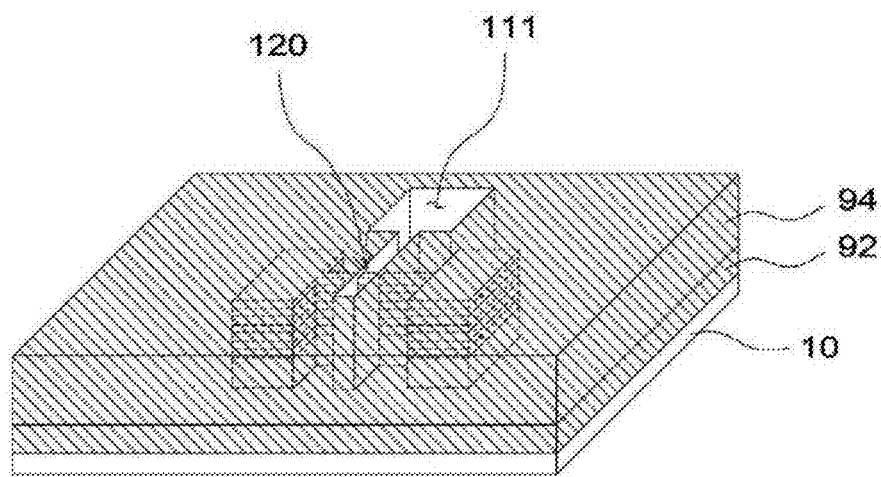

Subsequently, as shown in FIG. 15, the channel fin 120 is exposed to a space 111 in which the dummy gate 110 is removed (step 14). In this case, the first insulating layer pattern 34 disposed on the fin channel 120 may be removed by the etching selectivity while removing the dummy gate 110 or may be etched after the silicon nanowires 22 are formed.

Figure 22:
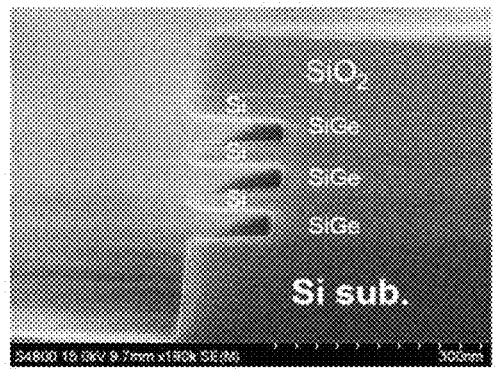
FIG. 22 is an SEM image illustrating a method of selectively etching silicon germanium layers on a channel fin (active layer pattern) to float silicon layers.

Next, the silicon germanium layers 22 are selectively etched from the exposed channel fin 120 to float the silicon layers 24 (step 15). FIG. 22 shows that the silicon germanium layers 22 are selectively etched in the channel fin (active layer pattern) 120. To do this, it may be performed by one of process conditions: 1) a chemical dry etching at 350 mTorr, Micro wave power 700 W, RIE power 0 W, $CF_4$ 80 sccm, $N_2$ 12 sccm, and $O_2$ 12 sccm, 2) a wet etching with $NH_4OH:H_2O_2$:D.I. water=1:1:5, and 3) a chemical dry etching with HCl.

Figure 23A:
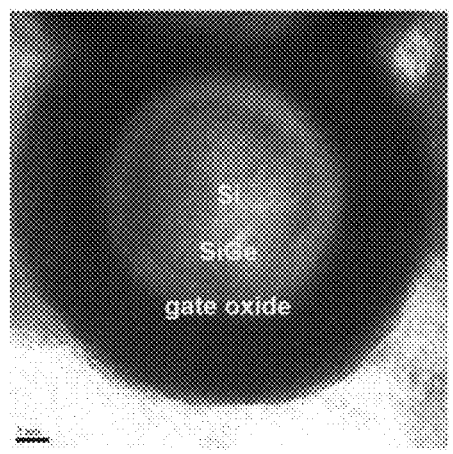
FIG. 23A is a TEM image illustrating the formation of one or more vertically stacked silicon nanowires with silicon layers floated by the method of FIG. 22, surrounding each silicon nanowire, and forming a silicon buffer layer, a silicon germanium shell, and a gate insulating film.
Figure 23B:
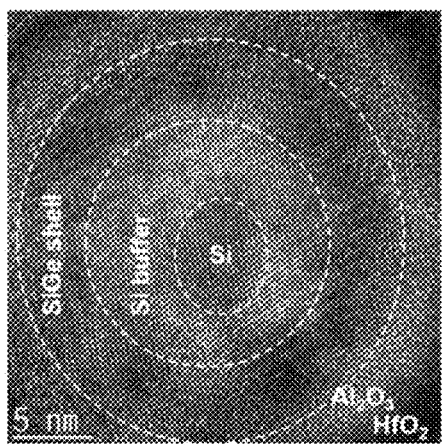
FIG. 23B is an enlarged view of FIG. 23A.

Next, as shown in FIGS. 23A and 23B, a silicon buffer layer is formed around each of the floating silicon layers 24 of the channel fin 120 (step 16). At this time, it is preferable to pre-clean the silicon layers 24, that is, silicon nanowires, by the mixed gas of $NF_3$ and $NH_3$, and then form a silicon buffer layer around each of the silicon layers. Process conditions for forming the Si buffer layer may be 670° C., 30 Torr, H 2 40 SLM, DCS 300 sccm, and 300 sec. The silicon nanowires may be formed to have a diameter of 10 nm or less, the silicon buffer layer (Si buffer layer) may be coated with a thickness of about the diameter of the silicon nanowires, and the thickness can be adjustable.

Figure 24:
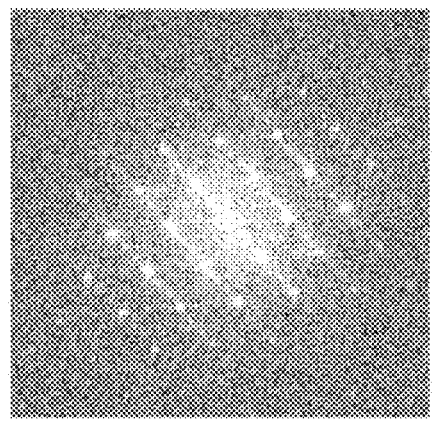
FIG. 24 is a Fast-Fourier Transform (FFT) pattern showing that the silicon nanowire part of FIG. 23B has a single crystal characteristic with a diameter of 10 nm.

FIG. 24 is a Fast-Fourier Transform (FFT) pattern showing that the silicon nanowires of FIG. 23B having a diameter of 10 nm have single crystal properties.

Next, as shown in FIG. 23B, a silicon germanium shell (SiGe shell) is formed on the buffer layer (Si buffer layer) (step 17). In this embodiment, as shown in FIGS. 23A and 23B, the silicon germanium shell (SiGe shell) may have a uniform thickness by forming on a silicon buffer layer (Si buffer layer). That is, rather than forming a silicon germanium shell (SiGe shell) directly on the silicon nanowires, after forming a silicon buffer layer (Si buffer layer) to a thickness of about the diameter of the silicon nanowire, it is preferable to form the silicon germanium shell (SiGe shell) on the silicon buffer layer with a uniform thickness so that it becomes possible to ensure uniformity in channel control of a device. Process conditions for forming the silicon germanium shell may be 670° C., 30 Torr, H2 40 SLM, DCS 750 sccm, GeH4 50 sccm, HCl 250 sccm, and 48 sec.

In remaining processes, the gate insulating film and the gate are sequentially formed by an atomic layer deposition (ALD) surrounding the silicon germanium shell (SiGe shell) as usual (step 18). When forming the gate insulating film, it is preferable that an aluminum oxide layer $Al_2O_3$ and a hafnium oxide layer $HfO_2$ are sequentially stacked from the silicon germanium shell as shown in FIG. 23B, but one of the aluminum oxide and hafnium oxide layers may be used.

Second Embodiment

Methods of fabricating a semiconductor device according to a second embodiment of the present invention may be the same as in the first embodiment described above except the processes up to the step of forming the dummy gate 110.

That is, the second embodiment may comprise some steps of the first embodiment described above that, as shown in FIG. 2, the silicon germanium layer 22 and the silicon layer 24 are alternately stacked one or more times on the semiconductor substrate 1 to form the active layer 20, and that, as shown in FIG. 13, the dummy gate 110 is formed on the predetermined separation insulating layer 92 to wrap active layer pattern 100, which is a channel fin. And the other steps may be different. In addition, after forming the dummy gate 110 and then removing the insulating layer 94, the portion (including source and drain regions) not covered by the dummy gate 110 is removed, and an in-situ doping may be also used to grow silicon, silicon germanium, or germanium to form the embedded source and drain regions.

In the forming of the dummy gate 110, in order to implement a dummy gate having a fine line width, the dummy gate 110 may be implemented in the same or similar manner as the first embodiment.

Specifically, the dummy gate 110 may be formed of polysilicon. Before patterning the dummy gate 110, a silicon oxide film is first formed on the channel fin 100 as a material for sidewall patterning on the polysilicon layer for a dummy gate, and then a sidewall insulating layer is formed of silicon nitride $Si_3N_4$. After that, the silicon oxide film, which is a dummy pattern, is selectively etched to leave the silicon nitride layer, which is a sidewall insulating layer, and then the polysilicon layer, which is to form a dummy gate located below, is etched using the sidewall insulating layer as an etching mask to form a fine gate defining the line width as a width of the sidewall. Thereafter, an impurity doping is performed on a channel region and source and drain regions not covered by the dummy gate 110.

Next, as shown in FIG. 14, an insulating layer 94 is deposited to cover the dummy gate 110 and the channel fin active layer pattern 100 and etched to expose the dummy gate 110 is exposed through a planarization process (step 1).

Here, when the insulating layer 94 is a silicon oxide layer, the dummy gate 110 formed of polysilicon functions as an etch stopper during the planarization process (e.g., CMP process).

FIG. 19 is a plan view of an SEM image showing a semiconductor device connected with 10 channel fins (i.e., 10 active layer patterns) horizontally in an embodiment subsequent to FIG. 18. FIG. 20 is an enlarged view illustrating main parts of a TEM image and a stacked structure of channel fins (active layer patterns) showing a part of vertical cutting of 10 channels according to a dotted line of FIG. 19. FIG. 21 is an enlarged TEM image of the stacked structure of the channel fins (active layer patterns) of FIG. 20, showing that the fins have a width of several tens of nm (30-40 nm). Referring to FIGS. 19 to 21, it has ten channel fins (active layer patterns) horizontally, each of the channel fins (active layer patterns) may have a structure in which the silicon germanium layer 22 and the silicon layer 24 are alternately stacked three times. Accordingly, it is possible to fabricate a semiconductor device having a structure of a plurality of silicon nanowire channels stacked horizontally and vertically. The silicon nanowires may have a diameter of 10 nm or less, and according to the process described later, by forming a silicon germanium shell on the surface of each silicon nanowire to a thickness close to the nanowire diameter, a semiconductor device having a silicon germanium shell channel of uniform thickness can be fabricated.

Subsequently, as shown in FIG. 15, the channel fin 120 is exposed to a space 111 in which the dummy gate 110 is removed (step 2).

Next, the silicon germanium layers 22 are selectively etched from the exposed channel fin 120 to float the silicon layers 24 (step 3). FIG. 22 shows that the silicon germanium layers 22 are selectively etched remaining the silicon layers 24 in the channel fin (active layer pattern) 120. To do this, it may be performed by one of process conditions: 1) a chemical dry etching at 350 mTorr, Micro wave power 700 W, RIE power 0 W, $CF_4$ 80 sccm, $N_2$ 12 sccm, and $O_2$ 12 sccm, 2) a wet etching with $NH_4OH:H_2O_2:D.I.$ water=1:1:5, and 3) a chemical dry etching with HCl.

Next, as shown in FIGS. 23A and 23B, a silicon buffer layer is formed around each of the floating silicon layers 24 of the channel fin 120 (step 4). At this time, it is preferable to pre-clean the silicon layers 24, that is, silicon nanowires, by the mixed gas of $NF_3$ and $NH_3$, and then form a silicon buffer layer around each of the silicon layers. Process conditions for forming the Si buffer layer may be 670° C., 30 Torr, H 2 40 SLM, DCS 300 sccm, and 300 sec. The silicon nanowires may be formed to have a diameter of 10 nm or less, the silicon buffer layer (Si buffer layer) may be coated with a thickness of about the diameter of the silicon nanowires.

FIG. 24 is a Fast-Fourier Transform (FFT) pattern showing that the silicon nanowire part of FIG. 23B has a single crystal characteristic with a diameter of 10 nm.

Next, as shown in FIG. 23B, a silicon germanium shell (SiGe shell) is formed on the buffer layer (Si buffer layer) (step 5). In this embodiment, as shown in FIGS. 23A and 23B, the silicon germanium shell (SiGe shell) may have a uniform thickness by forming on a silicon buffer layer (Si buffer layer). That is, rather than forming a silicon germanium shell (SiGe shell) directly on the silicon nanowires, after forming a silicon buffer layer (Si buffer layer) to a thickness of about the diameter of the silicon nanowire, it is preferable to form the silicon germanium shell (SiGe shell) on the silicon buffer layer to have a uniform thickness so that it becomes possible to ensure uniformity in channel control of a device. Process conditions for forming the silicon germanium shell may be 670° C., 30 Torr, H2 40 SLM, DCS 750 sccm, GeH4 50 sccm, HCl 250 sccm, and 48 sec.

In remaining processes, the gate insulating film and the gate are sequentially formed surrounding the silicon germanium shell (SiGe shell) as usual (step 6). When forming the gate insulating film, it is preferable that an aluminum oxide layer $Al_2O_3$ and a hafnium oxide layer $HfO_2$ are sequentially stacked from the silicon germanium shell as shown in FIG. 23B.

Third Embodiment

A third embodiment of the present invention relates to a semiconductor device, which is fabricated according to the first or second embodiment described above and has a silicon germanium shell channel of uniform thickness.

As can be seen from FIGS. 19 to 21, the semiconductor device according to the present embodiment has a silicon nanowire structure in which a plurality of layers is stacked vertically and horizontally between a source and a drain. Here, each silicon nanowire surface is surrounded by the silicon buffer layer having a thickness close to the diameter of the nanowire, and then a silicon germanium shell channel having a uniform thickness is formed on the silicon buffer layer. Therefore, the structure may be one or a plurality of horizontally and vertically stacked silicon germanium shell channels having a uniform thickness.

As a specific example, the silicon nanowire may have a diameter of 10 nm or less. The thickness of each silicon germanium shell channel may be 3 to 5 nm, and of course, the silicon germanium shell channel may have a thickness in A unit of less than that. The silicon germanium shell channel functions trapping holes between the silicon buffer layer and the gate insulating film.

This work was supported by the Korean Ministry of Trade, Industry and Energy (MOTIE) through the Korea Semiconductor Research Consortium (KSRC) Support Program for the development of the future semiconductor devices under Grant 10052928.

What is claimed is:
1. A method for fabricating a semiconductor device having a silicon germanium shell channel comprising:
   a first step of forming an active layer by alternately stacking a silicon germanium layer and a silicon layer on a semiconductor substrate one or more times;
   a second step of sequentially forming a first insulating layer, a second insulating layer, a third insulating layer, a lower insulating layer etching silicon layer, and a fourth insulating layer for dummy patterns on the active layer;
   a third step of forming one or more dummy patterns by etching the fourth insulating layer;
   a fourth step of forming a sidewall insulating layer on each sidewall of the dummy patterns;
   a fifth of forming a plurality of channel fine patterns by removing both ends of the sidewall insulating layer exposed by removing the dummy patterns;
   a sixth of forming a source and drain patterns at both ends of the plurality of channel fine patterns, at least one of the channel fine patterns connecting the source and drain patterns;
   a seventh step of etching the lower insulating layer etching silicon layer using the source and drain patterns and the channel fine patterns as an etching hard mask;
   an eighth step of forming a first insulating layer pattern, a second insulating layer pattern, and a third insulating layer pattern by etching the third insulating layer, the second insulating layer, and the first insulating layer sequentially to expose the active layer using a silicon mask pattern of the lower insulating layer etching silicon layer exposed after removing the source and drain patterns and the channel fine patterns;
   a ninth step of forming an active layer pattern by etching the active layer and a part of the semiconductor substrate sequentially using an insulating mask pattern of the third insulating layer exposed after removing the silicon mask pattern;
   a tenth step of covering the etched semiconductor substrate, the active layer pattern, the first insulating layer pattern, the second insulating layer pattern, and the third insulating layer pattern with a fifth insulating layer and exposing the second insulating layer pattern through a planarization process;
   an eleventh step of forming a separation insulating layer on the etched semiconductor substrate by etching the fifth insulating layer using the second insulating pattern and the first insulating pattern as a mask;
   a twelfth step of forming a dummy gate on the separation insulating layer to surround the first insulating layer pattern and the active layer pattern;
   a thirteenth step of covering a channel fin including the dummy gate, the first insulating layer pattern, and the active layer pattern with the sixth insulating layer on the separation insulating layer, and exposing the dummy gate through a planarization process;

a fourteenth step of exposing the channel fin to a space in which the dummy gate is removed;

a fifteenth step of selectively etching silicon germanium layers in the exposed channel fin to float silicon layers;

a sixteenth step of forming a silicon buffer layer around each of the floating silicon layers;

a seventeenth step of forming a silicon germanium shell on the silicon buffer layer; and an eighteenth step of sequentially forming a gate insulating film and a gate surrounding the silicon germanium shell.

2. The method of claim 1, wherein the active layer of the first step is formed by alternately stacking a silicon germanium layer and a silicon layer three or more times, and the source and drain patterns of the sixth step are formed at both ends of two or more of the channel fine patterns.

3. The method of claim 2, wherein the first insulating layer, the third insulating layer and the fourth insulating layer are silicon oxide films, and the second insulating layer is a silicon nitride film.

4. The method of claim 1, wherein a surface treatment process is further advanced between the fifteenth and sixteenth steps by flowing a predetermined gas around the floating silicon layers.

5. The method of claim 4, wherein the gas is a mixture of $NF_3$ and $NH_3$ or $H_2$, process conditions for forming the silicon buffer layer is 670° C., 30 Torr, $H_2$ 40 slm, DCS 300 sccm, and 300 sec, and process conditions for forming the silicon germanium shell is 670° C., 30 Torr, $H_2$ 40 slm, DCS 750 sccm, $GeH_4$ 50 sccm, HCl 250 sccm, and 48 sec.

6. The method of claim 4, wherein the gate insulating film surrounds the silicon germanium shell, and an aluminum oxide layer $Al_2O_3$ and a hafnium oxide layer $HfO_2$ are sequentially stacked.

7. The method of claim 2, wherein a surface treatment process is further advanced between the fifteenth and sixteenth steps by flowing a predetermined gas around the floating silicon layers.

8. The method of claim 7, wherein the gas is a mixture of $NF_3$ and $NH_3$ or $H_2$, process conditions for forming the silicon buffer layer is 670° C., 30 Torr, $H_2$ 40 slm, DCS 300 sccm, and 300 sec, and process conditions for forming the silicon germanium shell is 670° C., 30 Torr, $H_2$ 40 SLM, DCS 750 sccm, $GeH_4$ 50 sccm, HCl 250 sccm, and 48 sec.

9. The method of claim 7, wherein the gate insulating film surrounds the silicon germanium shell, and an aluminum oxide layer $Al_2O_3$ and a hafnium oxide layer $HfO_2$ are sequentially stacked.

10. The method of claim 3, wherein a surface treatment process is further advanced between the fifteenth and sixteenth steps by flowing a predetermined gas around the floating silicon layers.

11. The method of claim 10, wherein the gas is a mixture of $NF_3$ and $NH_3$ or $H_2$, process conditions for forming the silicon buffer layer is 670° C., 30 Torr, $H_2$ 40 SLM, DCS 300 sccm, and 300 sec, and process conditions for forming the silicon germanium shell is 670° C., 30 Torr, $H_2$ 40 SLM, DCS 750 sccm, $GeH_4$ 50 sccm, HCl 250 sccm, and 48 sec.

12. The method of claim 10, wherein the gate insulating film surrounds the silicon germanium shell, and an aluminum oxide layer $Al_2O_3$ and a hafnium oxide layer $HfO_2$ are sequentially stacked.

13. A semiconductor device fabricated by the method of claim 1 having a silicon germanium shell channel of uniform thickness.

14. A method for fabricating a semiconductor device having a silicon germanium shell channel comprising: forming an active layer pattern by alternately stacking a silicon germanium layer and a silicon layer on a semiconductor substrate one or more times, and forming a dummy gate by wrapping the active layer pattern on a predetermined separation insulating layer, and further comprising:

a first step of covering the dummy gate and the active layer pattern, which is a channel fin, on the separation insulating layer with an insulating layer, and exposing the dummy gate by a planarization process;

a second step of exposing the channel fin to a space in which the dummy gate is removed;

a third step of selectively etching silicon germanium layers in the exposed channel fin to float silicon layers;

a fourth step of forming a silicon buffer layer around each of the floating silicon layers;

a fifth step of forming a silicon germanium shell on the silicon buffer layer; and a sixth step of sequentially forming a gate insulating film and a gate surrounding the silicon germanium shell.

15. The method of claim 14, wherein the active layer pattern is formed by alternately stacking a silicon germanium layer and a silicon layer three or more times.

16. The method of claim 14, wherein the gate insulating film surrounds the silicon germanium shell, and an aluminum oxide layer $Al_2O_3$ and a hafnium oxide layer $HfO_2$ are sequentially stacked.

17. The method of claim 14, wherein a surface treatment process is further advanced between the third and fourth steps by flowing a predetermined gas around the floating silicon layers.

18. The method of claim 17, wherein the gas is a mixture of $NF_3$ and $NH_3$ or $H_2$, process conditions for forming the silicon buffer layer is 670° C., 30 Torr, $H_2$ 40 SLM, DCS 300 sccm, and 300 sec, and process conditions for forming the silicon germanium shell is 670° C., 30 Torr, $H_2$ 40 SLM, DCS 750 sccm, $GeH_4$ 50 sccm, HCl 250 sccm, and 48 sec.

19. A semiconductor device fabricated by the method of claim 14 having a silicon germanium shell channel of uniform thickness.

* * * * *